United States Patent [19]

Evans

[11] Patent Number: 4,599,559
[45] Date of Patent: Jul. 8, 1986

[54] TEST PROBE ASSEMBLY FOR IC CHIPS

[75] Inventor: Arthur Evans, Brookfield Center, Conn.

[73] Assignee: Wentworth Laboratories, Inc., Brookfield, Conn.

[21] Appl. No.: 757,502

[22] Filed: Jul. 22, 1985

Related U.S. Application Data

[63] Continuation-in-part of Ser. No. 491,233, May 3, 1983, abandoned.

[51] Int. Cl.$^4$ ............................................. G01R 1/073
[52] U.S. Cl. .............................. 324/158 P; 324/72.5; 324/158 F
[58] Field of Search ........... 324/158 P, 158 F, 73 PC, 324/72.5; 29/574

[56] References Cited

U.S. PATENT DOCUMENTS 3,445,770  5/1969  Harmon .......................... 324/158 P

FOREIGN PATENT DOCUMENTS 55-23437  2/1980  Japan .
56-39885  10/1981  Japan .

OTHER PUBLICATIONS

Probe-Rite Inc. 1974 product catalog.

Primary Examiner—Stewart J. Levy
Assistant Examiner—Stephen M. Baker
Attorney, Agent, or Firm—Michael Ebert

[57] ABSTRACT

A test probe assembly for checking an integrated circuit chip before terminal leads are applied to the contacts thereof which are deployed on the chip in a common plane. The assembly includes a planar insulation card provided with a port and having a printed circuit thereon whose traces are connected to a plurality of test terminals connectable to external testing equipment. Surrounding the port and bonded to the card is a mounting ring of dielectric material having a flat face on which is supported a radial array of fine wires lying in a horizontal plane. These are maintained in their assigned positions by a layer of dielectric material adherent to the face, the wires being embedded in the layer. The wires cantilever across the port and converge toward the central region thereof below which is disposed the chip to be tested, the tapered leading end of each wire being double bent to define a needle having a shank section and a tip section terminating in a tip which engages a respective contact on the chip. The tip section has a downward slope whereby the tips of the needles are exposed to view through a microscope for purposes of alignment. The trailing end of each wire is soldered to a respective trace connecting each needle to a test terminal.

7 Claims, 7 Drawing Figures

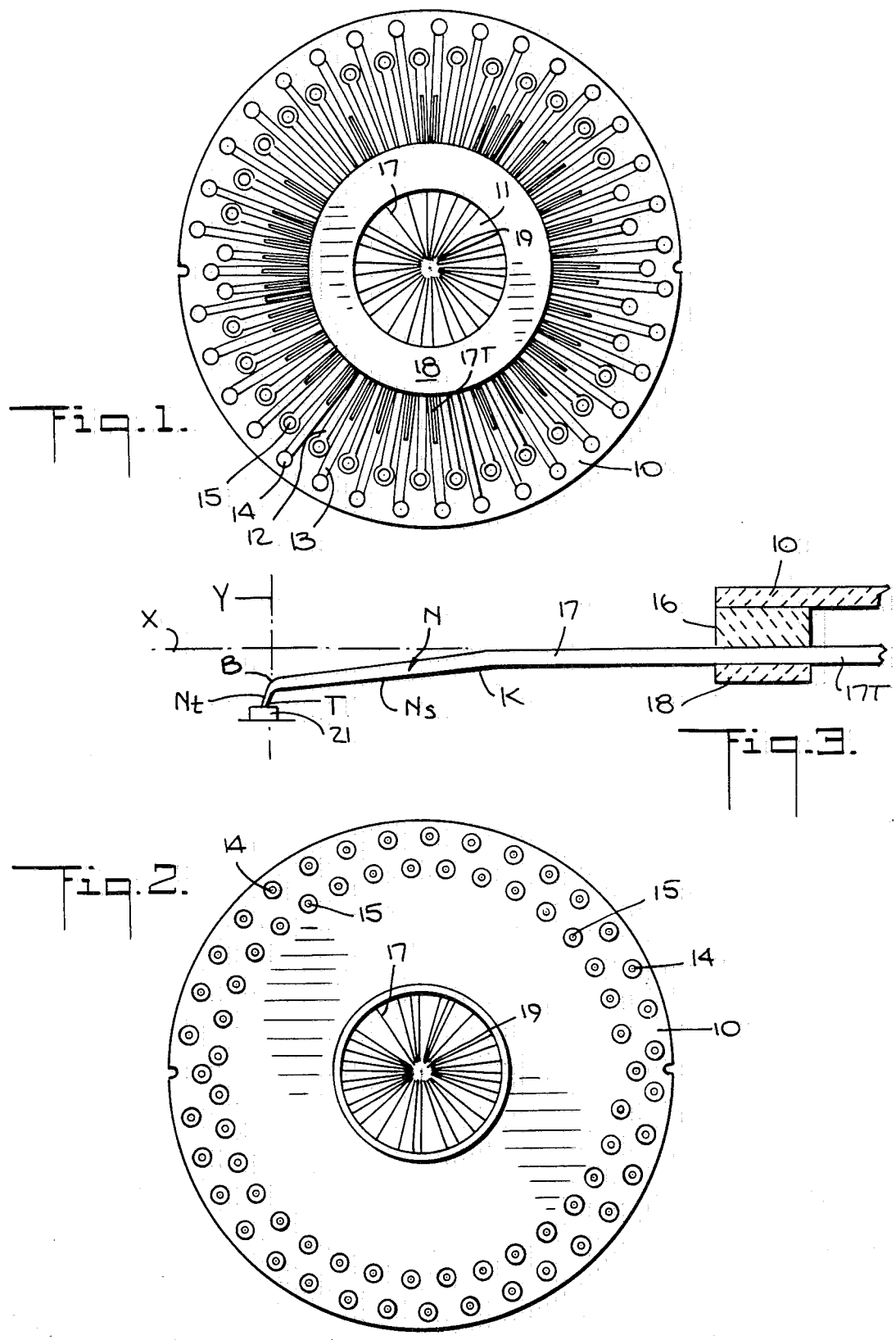

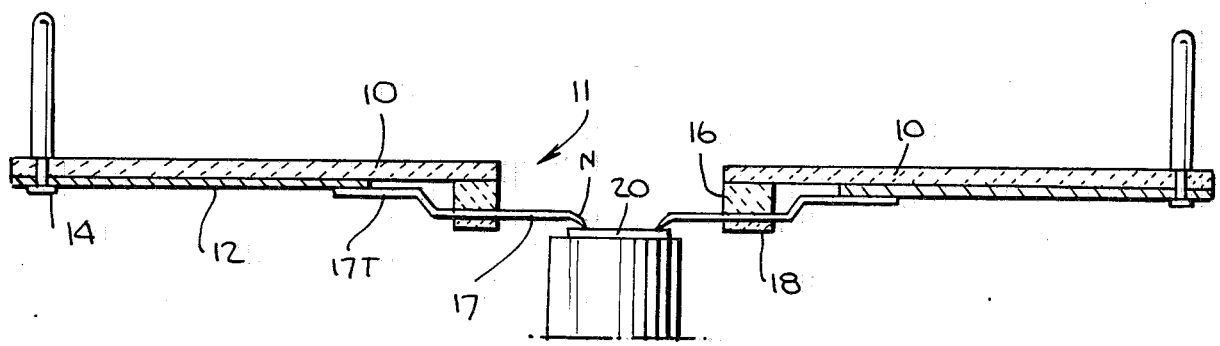
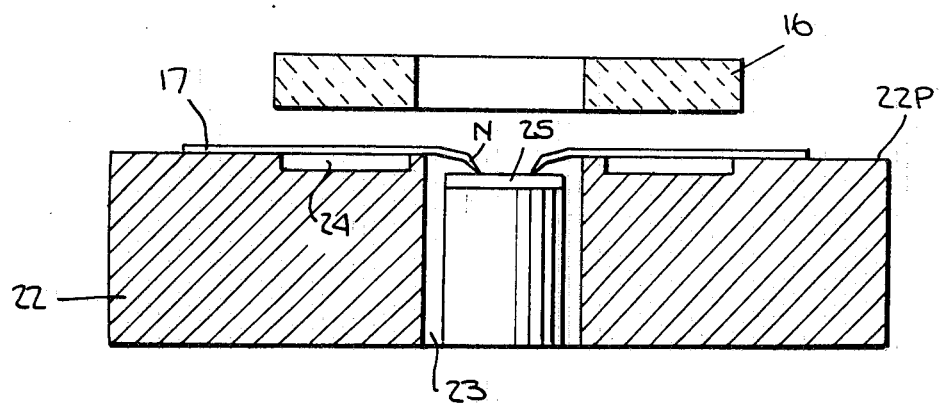

TEST PROBE ASSEMBLY FOR IC CHIPS

RELATED APPLICATIONS

This application is a continuation-in-part of my co-pending application Ser. No. 491,233 filed 05/03/83, now abandoned, having the same title.

BACKGROUND OF THE INVENTION

Field of Invention

This invention relates generally to the testing of integrated circuit chips, and, more particularly to a microelectronic test probe assembly for this purpose.

Many circuits and complex multi-stage electronic systems previously regarded as economically unfeasible and impractical, are now realizable in integrated circuit form. The fabrication of a single-crystal monolithic circuit involves the formation of diodes, transistors, resistors and capacitors on a single microelectronic substrate. In practice, a microelectronic substrate for semiconductor integrated circuits is sealed on a silicon wafer, the circuit patterns being applied to the wafer by photolithography. Each wafer contains the patterns of many identical integrated circuits, the wafer being sliced into "dice", each die or chip containing a single integrated circuit.

In a typical integrated circuit (IC) chip, the input, output, power supply and other terminals of the circuit are formed by metallized contacts, usually deployed along the margins of the circuit pattern. The outline of the chip is either square or rectangular, and the marginal locations of the contacts thereon depend on the circuit configuration and the available marginal space. In some instances, therefore, the contacts may lie in uniform rows along the margins, and in other cases, the contacts may be randomly spaced from each other.

For the purpose of testing any type of integrated-circuit patterns, before the application thereto of leads to connect the contacts to other components, various types of test probe cards have been developed. In one well-known form, the probe card consists of a printed circuit board having an opening or port therein to provide access to an IC pattern. This opening is surrounded by a circle of conductive pads connected by the traces of the printed circuit to terminals on the card which, in turn, are connected to test equipment appropriate to the circuit. The number of pads in the circle determines the maximum capacity of the probe card. If, for example, the card has forty-eight pads, it is capable of testing IC patterns having forty-eight contacts or less.

In setting up a probe card for a particular IC chip pattern, probes constituted by needles of tungsten are affixed to selected pads, the needles extending across the opening. The length and orientation of each needle is such that its point is adapted to engage a respective contact on the IC pattern.

To assemble a probe card for this pattern, one must attach needles to those pads which are most conveniently located with respect to the contacts on the chip. The stretch of each needle depends on the distance between its pad and the particular contact to be engaged. Hence the needles in a conventional probe card vary in length.

Since all of the contacts in the IC pattern lie in a common plane and must be simultaneously engaged in order to carry out testing, it is essential that all needle points lie in a plane parallel to the common IC plane. Consequently, a fundamental requirement of a probe card is planarization of the needle points. The nature of conventional probe cards and the character of the assembly fixtures for setting up the probe positions for such cards are such that it is virtually impossible to assemble probes with needle points lying exactly in the same plane.

With a view to providing an improved microelectronic test probe card, the Garretson et al. U.S. Pat. Nos. 3,835,381 and 3,905,098 disclose a structure in which needle-like probes formed of tungsten wire are supported on the tapered face of a dielectric base ring surrounding a circular opening in the card, the wires being in a generally conical array with respect to the opening. A layer of dielectric material adherent to the tapered surface of the ring acts to secure the wires thereto, the wires being embedded in the layer. The outer ends of the wires are connected to terminals on the card, whereas the inner ends leading to the apex of the cone are bent down to form tips which engage the respective contacts on the IC chip to be tested.

Because the tips of the needles must all lie in a common plane, the angles of the needles in the conical array thereof must be adjusted relative to the tapered surface of the ring to engage the respective contacts on the chip. Thus a steeper angle is required to reach a contact, say, at the corner of the rectangular chip than a contact displaced from a corner. To this end, feeler gauges are used by Garretson et al. to control the positions and locations of each needle on the tapered face of the ring.

After the needles have been carefully adjusted to assume their proper angles, an epoxy or other dielectric material is superimposed over the array of needle probes so as to embed the probes at their assigned angle and position in the epoxy. The assembly so arranged is then heated to cause hardening of the epoxy to thereby retain the array of needles at their selected sites.

In practice, it is a relatively difficult matter to construct a test probe card of the Garretson et al. type, for to create the necessary conical array of needles, one must use a jig having a conical configuration; and because the needles must be positioned at various angles relative to the conical surface of the jig, the needles make point contact with the jig only at the back end thereof and tend to fall out of position. Also, it is difficult to set the needles relative to the jig to allow proper clearance therebetween for epoxy flow.

A further disadvantage is that because the needles are at different angles, the scrub characteristics of the needles are not uniform. Moreover, as needles are added to the jig, it is impossible to control the final angle of each needle, as all needles in the jig have slightly different angles due to the cone effect.

When the needles are brought into engagement with the contact pads on the chip, the tips scrub the pad surfaces to remove oxide film therefrom and thereby improve electrical contact therewith. But if the scrubbing action of the needles is not uniform, then some of the needles will go beyond the pads and invade the surface of the chip and do damage to the circuit.

A proper scrubbing action is important, for without scrubbing to remove non-conductive oxide material from the engaged contact pads on the chip being tested, the needles will make poor electrical contact therewith and an effective test cannot be performed.

Of background interest are the following references: the U.S patents to Ardezzone U.S. Pat. No. 3,891,924; Tarzwell, U.S. Pat. No. 4,161,692; Harmon, U.S. Pat.

No. 3,445,770; and Hostetter, U.S. Pat. No. 3,613,001; the Japanese patents to Hasagawa, No. 0135938 and Ookubo, No. 0023437; the West German patent No. 1,910,314 to Epple; and the IBM Technical Disclosure Bulletin, Vol. 18, No. 10, March 1976, Byrnes, H. "Test Contactor".

SUMMARY OF INVENTION

In view of the foregoing, the main object of this invention is to provide a probe test assembly for testing integrated circuit chips in which a radial array of fine wires, all lying in a horizontal plane, are supported on a mounting ring surrounding a circular port in a card, the wires converging toward the central region of the port below which is exposed the chip to be tested, the leading ends of the wires being tapered and double bent to define needles whose tip sections terminate in tips which engage the respective contacts of the chip, the tip sections being sloped to expose the tips to view.

Among the advantages of a probe test assembly in accordance with the invention over a prior art assembly in which the wires lie in a conical array is that the slope angle between each needle tip section and the surface of the chip or other microelectronic device under test is uniform. As a consequence, all tips at the ends of the needles may be identically viewed under a microscope, thereby facilitating alignment and placement of the probe card when in use for electrical testing and measurement.

Also an object of the invention is to provide a test probe assembly having uniform and consistent scrubbing characteristics.

Yet another object of the invention is to provide a probe test assembly in which the radial array of wires lies in a horizontal plane, thereby obviating the need for feeler gauges to locate and orient the wires on a probe ring fixture, as in prior art arrangements.

It is a further object of the invention to provide an efficient and reliable test probe assembly which may be fabricated without difficulty and manufactured at relatively low cost.

Briefly stated, these objects are attained in a test probe assembly for checking an integrated circuit chip before terminal leads are applied to the contacts thereof which are deployed on the chip in a common plane. The assembly includes a planar insulation card provided with a port and having a printed circuit thereon whose traces are connected to a plurality of test terminals connectable to external testing equipment. Surrounding the port and bonded to the card is a mounting ring of dielectric material having a flat face on which is supported a radial array of fine wires lying in a horizontal plane. These are maintained in their assigned positions by a layer of dielectric material adherent to the face, the wires being embedded in the layer. The wires cantilever across the port and converge toward the central region thereof below which is disposed the chip to be tested, the tapered leading end of each wire being double bent to define a needle having a shank section and a tip section terminating in a tip which engages a respective contact on the chip. The tip section has a downward slope whereby the tips of the needles are exposed to view through a microscope for purposes of alignment. The trailing end of each wire is soldered to a respective trace connecting each needle to a test terminal.

OUTLINE OF DRAWING

For a better understanding of the invention as well as other objects and further features thereof, reference is made to the following detailed description to be read in conjunction with the accompanying drawings, wherein:

FIG. 1 is a bottom plan view of a preferred embodiment of a test probe assembly in accordance with the invention;

FIG. 2 is a top plan view of the assembly.

Figure 4:
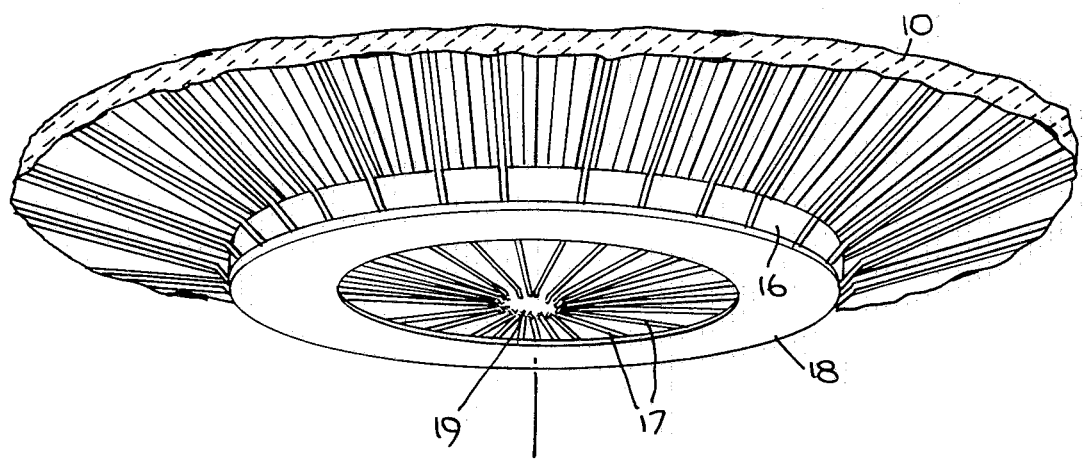
Figure 5:
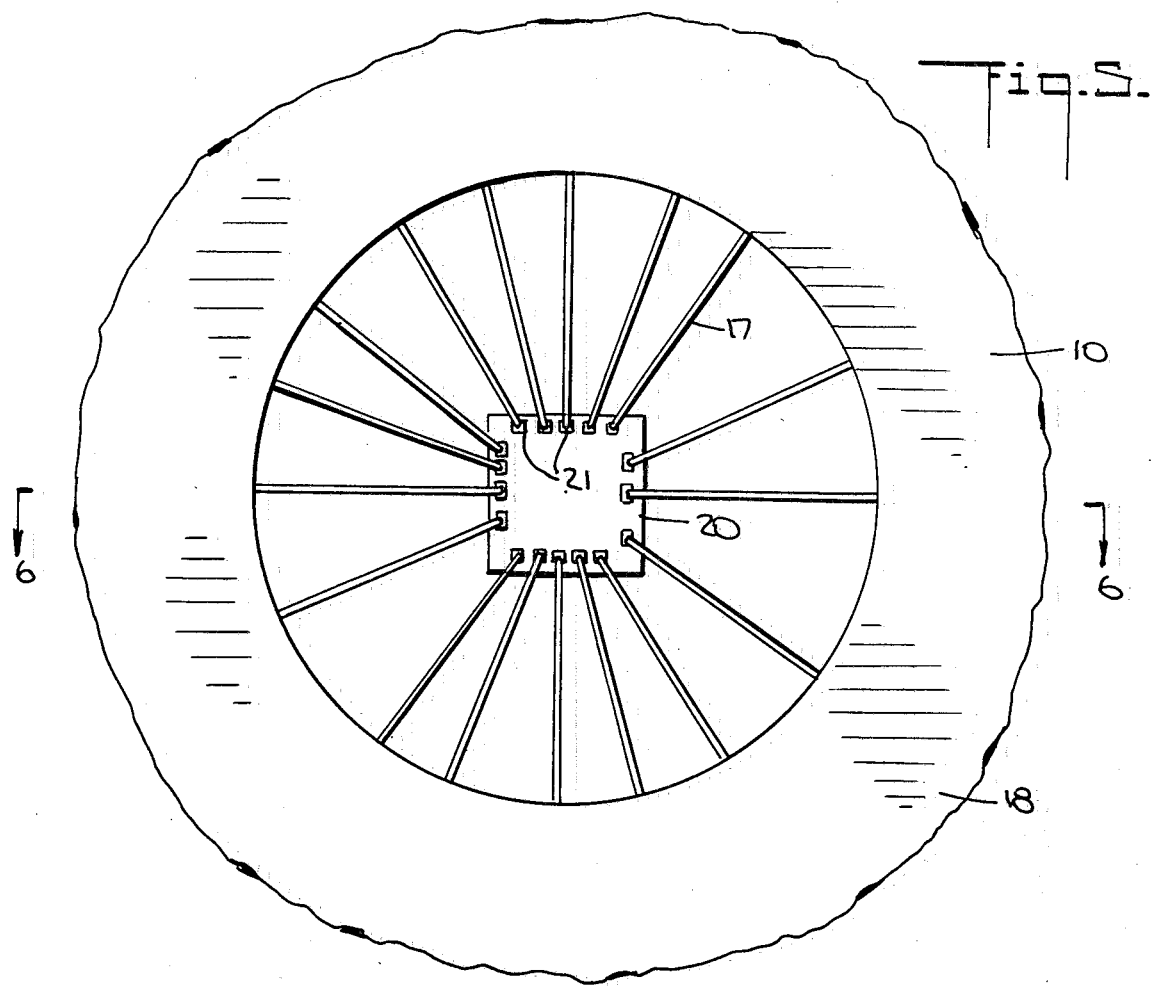

FIG. 3 separately illustrates in section, the mounting ring on the card and a single probe supported thereby;

FIG. 4 is a perspective view illustrating the relationship of the test probe assembly to an IC chip to be tested thereby;

FIG. 5 is an enlarged view of the chip being tested, with the needles of the assembly in engagement with the contacts of the chip;

FIG. 6 is a section taken in the plane indicated by line 6—6 in FIG. 5; and

FIG. 7 is a sectional view of the jig for setting up the array of probe wires to be supported on the ring.

DESCRIPTION OF INVENTION

The Assembly:

Referring now to FIGS. 1 and 2, there is illustrated a preferred embodiment of a test probe assembly in accordance with the invention for checking an integrated circuit chip before leads are connected to the contacts of the chip. The function of the test probe assembly is to engage the chip contacts and connect them to test terminals which in turn are connected to external test equipment so that the chip circuits may be fully tested to be sure that it satisfies the specifications therefor before the chip is permanently connected to its associated components.

The assembly includes a planar printed circuit board or card 10 fabricated of synthetic plastic or other insulating material which is structurally stable and of adequate strength. Card 10, which in the embodiment illustrated is circular in form, is provided with a circular central opening or port 11 to provide access to the chip to be tested. In practice, the planar card may be rectangular or in any other suitable configuration; and the port, rather than being circular, may be oblong or in any other geometrical form.

Formed on one face of card 10 by printed circuit techniques are two sets 12 and 13 of radial traces which are interleaved. Traces 13 are connected to test terminals 14 in an outer circular series thereof adjacent the periphery of the card. Traces 12, which are somewhat shorter than traces 13, are connected to test terminals 15 in an inner circular series thereof concentric with the outer series. The advantage of this interleaved arrangement of radial traces is that it makes possible a high density of test terminals in a relatively small area.

Each test terminal on the card takes the form of a metal grommet inserted in a card hole and adapted to receive a plug-in pin P6, as shown in FIG. 6, whereby the assembly can be plugged into a test equipment socket rather than being wired thereto terminal by terminal. In practice, the grommets, instead of being discrete elements, may be formed by plating the hole surfaces. Also, the terminals may take the form of edge contacts plated on the surface of the card.

Surrounding port 11 and secured to the card, as shown in FIGS. 3 and 4, is a mounting ring 16 which may be formed of ceramic, anodized aluminum or other dielectric material. The ring thus has a flat face parallel to the plane of the card for supporting at a raised position a radial array of fine wires 17, preferably made of tungsten. These wires are maintained in their assigned positions by a layer 18 of dielectric material which is adhered to the face of the ring, the wires being embedded therein. In practice, the layer may be molded of epoxy resin.

Wires 17 cantilever across port 11 and converge toward the central region 19 thereof, as shown in FIG. 4, just below which is the integrated circuit chip 20 to be tested. Chip 20, as shown in FIG. 5, has contacts 21 deployed thereon, all lying in a common horizontal plane, the contacts being located adjacent the margins of the chip.

As best seen in FIG. 3, the leading end of each wire 17 is tapered to define a needle N. Needle N is double bent to form a relatively long shank section $N_s$ and a short tip section $N_t$ terminating in a tip T. This tip engages a contact 21 on the chip to be tested when the chip is raised toward the test probe assembly.

Wire 17 held to the flat face of mounting ring 16 by dielectric layer 18, extends along a horizontal axis X. The shank section $N_s$ of the double bent needle N is downwardly inclined at an acute angle which in practice may be 8 degrees relative to horizontal axis X. The tip section $N_t$ of the needle has a downward slope and is at an acute angle with respect to the vertical axis Y. In practice this angle may be 15 degrees. Hence the angle between the tip section and the shank section which is obtuse.

These needle angles are uniform throughout the array of wires. And because the needle tips T in the array thereof lie at the ends of the sloped tip sections $N_t$, all of which have the same angle, they can readily be viewed through a microscope placed above the test probe assembly. In the present arrangement, the sloped tip sections of the needles do not block such viewing, as would be the case where the tip sections of the needles lie along a vertical axis at right angles to the cantilevered wires. This ability to view the tips through a microscope facilitates the alignment and placement of the test probe assembly when in use for electrical testing and measurement.

When the IC chip to be tested is raised upwardly to engage tip T of the probe, further upward movement of the tip causes the double-bent needle N to swing about the knee K where needle N joins wire 17. This swing gives rise to a slight lateral displacement of tip T along the surface of contact pad 21 engaged thereby to provide a desirable scrubbing action.

The present industry requirement in the IC test field is for a scrub of 0.0001 inch for each 0.001 inch of vertical movement of the probe tip. Vertical movement of the probe tip, or overdrive as it is called in the trade, is typically 0.003 to 0.005 inches of scrub. The geometry of the double bent needle N is such as to satisfy these requirements in a uniform and consistent manner, for all needles have the same geometry.

The trailing ends 17T of wires 17 which diverge outwardly from the ring, as shown in FIGS. 1 and 6, are soldered to individual traces on the printed circuit, so that each needle is connected to a respective test terminal 14 or 15 in the inner and outer series thereof.

The number of wires 17 in the array and their placement are determined by the number of contacts 21 and their placement on the integrated circuit chip 20 to be tested. Thus in the chip illustrated in FIG. 5, there are a relatively small number of contacts 21 deployed on chip 20; hence an equally small number of wires are required in the radial array, the placement of the wires being determined by the placement of these contacts. In practice, a much greater number of contacts and wires may be involved.

Fabrication of Sub-Assembly:

Referring now to FIG. 7, there is shown a jig 22 for fabricating a sub-assembly in accordance with the invention, the sub-assembly being in the form of a spider-like structure in which a radial array of wires whose leading ends are needles, is supported on mounting ring 16, the wires being maintained at their assigned positions by a layer 18 of epoxy material adherent to the face of the ring, the wires being embedded therein.

Jig 22 is provided with a planar face 22P and a central circular bore 23. An annular channel 24 is formed in the top face of jig 22 and is concentric with bore 23 to receive the flow of the moldable, resinous dielectric material.

Metal wires 17 of high conductivity are laid down on planar face 22P to create the desired radial array, the obtuse-angle needles N lying within bore 23, with the needle tips being received in the separate apertures of a patterned mask 25. This mask is preferably formed of a thin sheet of "Mylar" in a selected pattern determined by the contact position of the chip to be tested. Channel 24 is of uniform depth to form the desired thickness of the adhered layer 18. These wires may be of tungsten, berylium-copper or other suitable metal alloys.

After the wires are properly set up on the jig, ring 16, whose underside is coated with an epoxy layer, is brought down on the array and clamped to the jig in a fixture. This fixture is then placed in an oven and heated to a temperature of about 200° F. for a period, such as one hour, sufficient to effect curing and hardening of the resinous layer of dielectric epoxy in which the wires are embedded.

The resultant spider sub-assembly is removed from the fixture, the ring is bonded to the card around the port therein, and finally the trailing ends of the wires are soldered to the traces of the printed circuit.

The wires 17 are of uniform diameter and the preferred technique for tapering the leading end of each wire to create the tapered needle N is by electrochemical etching. This is carried out by computer control to maintain a uniform taper from needle to needle.

It is important to note that the diameter of the bend B (see FIG. 3) between tip section $N_t$ and shank section $N_s$ of tapered needle N is substantially smaller than the diameter of untapered wire 17. As shown in FIGS. 1 and 4, wires 17 converge toward a central region 17 just below which is an integrated circuit chip 20 to be tested. Hence the bends B of the needles at the periphery of region 19 are necessarily quite close to each other. The fact that these bends have a diameter much smaller than that of the converging wires makes it possible to provide a relatively high density of needles as is required when the chip to be tested has a large number of contacts to be engaged by the needles. This feature represents another significant advantage of the invention.

While there has been shown and described a preferred embodiment of a test probe assembly for IC chips in accordance with the invention, it will be appreciated that many changes and modifications may be made therein without, however, departing from the essential spirit thereof.

I claim:

1. A test probe assembly for testing an integrated circuit chip before leads are applied to the contacts thereof deployed on said chip in a common plane, said assembly having consistent scrubbing characteristics and comprising:
   A. a planar insulation card provided with a port, said card having on its underface a printed circuit whose traces are connected to a plurality of test terminals connectable to test equipment for testing the chip;
   B. a mounting ring of uniform thickness formed of dielectric material surrounding said port and secured to said card at the underface thereof; said ring having a planar face parallel to the plane of the card; and
   C. a radial array of fine wires having a predetermined diameter supported on the planar face of the ring and maintained in planar position thereon by a molded layer of dielectric material adherent to said face in which the wires are embedded, the wires being cantilevered from the ring across the port and converging toward the central region thereof, below which is disposed the chip to be tested which is raisable toward said card, the leading end of each cantilevered wire being tapered and being double bent to define a needle having a shank section which is downwardly inclined relative to the planar face of the ring and a relatively short tip section terminating in a tip which engages a respective contact on the chip which, as it is raised, causes lateral displacement of the tip to effect scrubbing of said contact, the tip section forming an obtuse angle with the shank section and having a downward slope whereby the tips of the needles are exposed to view through a microscope for purposes of alignment, the trailing end of each wire being connected to a respective trace, the diameter of the wire at the junction of the shank section and the tip section of the needle being substantially smaller than said predetermined diameter to make possible a high needle density.

2. A test probe assembly as set forth in claim 1, wherein each test terminal to which a wire is connected is provided with a pin which projects from the upper face of the card.

3. A test probe assembly as set forth in claim 1, wherein said shank section is downwardly inclined relative to said wire, the shank section and said tip section forming an obtuse angle.

4. An assembly as set forth in claim 1, wherein said wires are of tungsten.

5. An assembly as set forth in claim 1, wherein said layer is molded of epoxy resin.

6. An assembly as set forth in claim 1, wherein said ring is of anodized aluminum.

7. An assembly as set forth in claim 1, wherein said port is circular and is at the center of the card which is also circular.

* * * * *